(12) United States Patent
Leitz

(10) Patent No.: US 6,773,557 B2
(45) Date of Patent: Aug. 10, 2004

(54) SYSTEM FOR FREQUENCY ADJUSTMENT OF PIEZOELECTRIC RESONATORS BY DUAL-TRACK ION ETCHING

(75) Inventor: John R. Leitz, Victoria (AU)

(73) Assignee: Showa Shinku Co., Ltd., Sagamihara (JP)

( * ) Notice: Subject to any disclaimer, the term of this patent is extended or adjusted under 35 U.S.C. 154(b) by 476 days.

(21) Appl. No.: 09/774,234

(22) Filed: Jan. 31, 2001

(65) Prior Publication Data

US 2002/0100744 A1 Aug. 1, 2002

(51) Int. Cl.⁷ .............................................. C23C 14/32
(52) U.S. Cl. .......................... 204/192.34; 204/298.32; 204/298.36
(58) Field of Search ..................... 204/192.32, 192.33, 204/192.34, 298.31, 298.32, 298.34, 298.36

(56) References Cited

U.S. PATENT DOCUMENTS 5,662,782 A  * 9/1997 Gomi et al. ........... 204/192.34
6,368,664 B1 * 4/2002 Veerasamy et al. ...... 427/249.7
6,564,439 B1 * 5/2003 Takata et al. ............. 29/25.35

OTHER PUBLICATIONS

Castellano et al., "A Survey of Ion Beam Milling Techniques for Piezoelectric Device Fabrication", (1975).

* cited by examiner

Primary Examiner—Steven Versteeg
(74) Attorney, Agent, or Firm—Fay, Sharpe, Fagan, Minnich & McKee, LLP

(57) ABSTRACT

System for frequency adjustment of piezoelectric resonators by ion etching in vacuum, based on arranging the resonators in rows and columns on a tray that can be moved to simultaneously expose two rows of resonators to the two straight-track portions of an ion gun having a race-track-shaped beam pattern whose straight tracks are spaced at an integer multiple of the inter-row spacing d. As the tray is moved in steps of d, two rows can be etched simultaneously, and each row can be sequentially exposed to a "pre-etch" and "final-etch" stage, with time between the two stages for the resonators to cool down after the "pre-etch" stage.

9 Claims, 4 Drawing Sheets

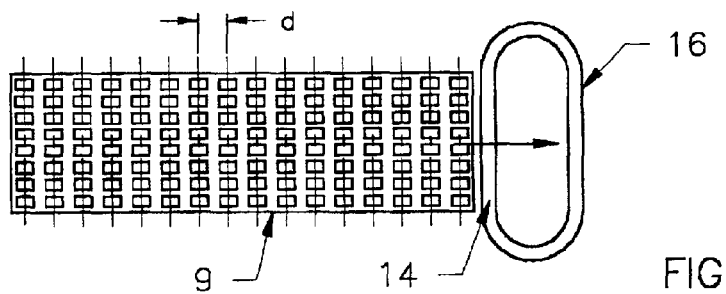
FIG. 3-0
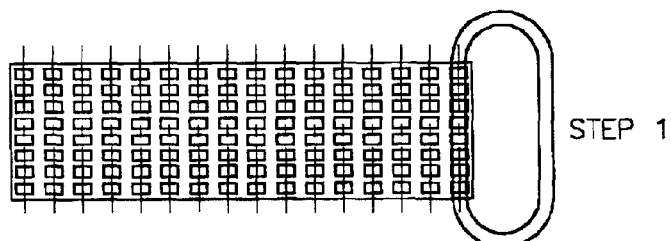
STEP 1
FIG. 3-1
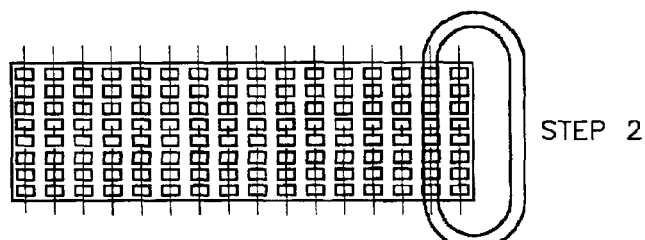
STEP 2
FIG. 3-2
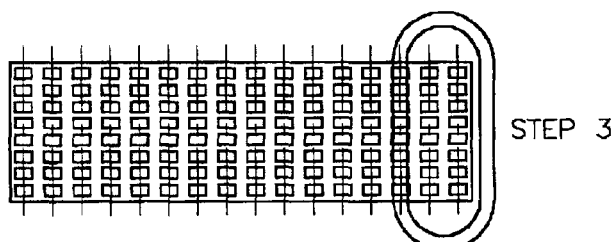
STEP 3
FIG. 3-3
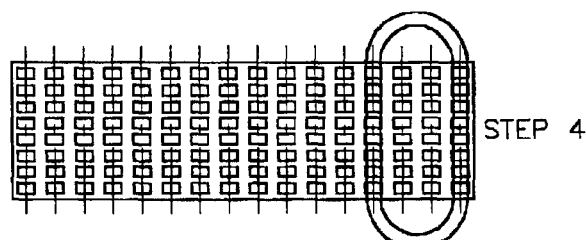
STEP 4
FIG. 3-4
FIG. 3

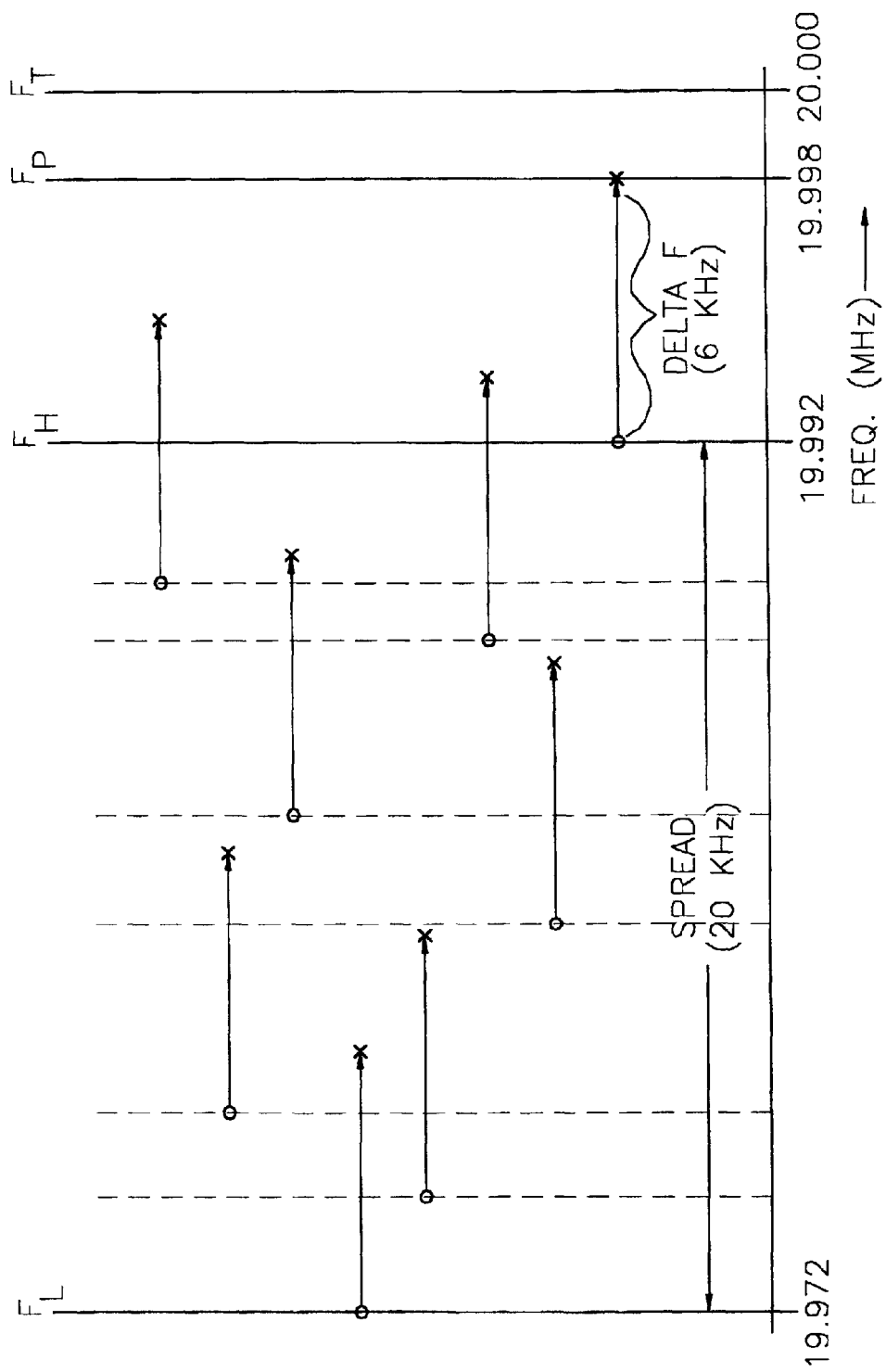

SYSTEM FOR FREQUENCY ADJUSTMENT OF PIEZOELECTRIC RESONATORS BY DUAL-TRACK ION ETCHING

BACKGROUND OF THE INVENTION

Frequency adjustment of piezoelectric resonators by ion etching has been known for decades. A summary is given in "A Survey of Ion Beam Techniques for Piezoelectric Device Fabrication" by R. N. Castellano et al, published in the "Proceeding of the 29$^{th}$ Annual Symposium on Frequency Control", 1975, pp 128–134. However, inspite of this and other publications, the method has only recently been applied to the large-scale commercial frequency adjustment of electroded resonators.

In the adjustment process the electroded surface of the resonator is exposed to the beam of an ion gun in vacuum. The beam bombards and etches off a surface layer, thereby reducing the electrode mass and raising the resonator frequency toward a target value.

The process creates heat in the resonator that is proportional to the etch rate. Since the resonator frequency is affected by heat, it drifts as the resonator cools down after adjustment, thereby reducing the accuracy of the adjustment. The accuracy can be improved by lowering the etch rate, but this reduces the system throughput. Efficient and accurate large-scale processing therefore requires maximizing both the throughput and the accuracy of the adjustment system. This application describes such a system.

To our knowledge, the published reports of frequency adjustment by ion etching have used ion guns of the so-called "Kaufman" design. These guns include two heated filaments, one serving as a grid for controlling the ion beam, the other for neutralizing the ion beam. These filaments require relatively frequent maintenance.

The systems described in this application employ a so-called "Anode Layer" gun, which has no filaments and therefore requires little maintenance. However, it has the beam pattern of a closed, relatively narrow path rather than a contiguous area. The path can be circular or partially linear, but it must include curves for the path to be closed.

SUMMARY OF THE INVENTION

The invention relates to the frequency adjustment of piezoelectric resonators by ion etching in vacuum. It describes a novel system for maximizing both the throughput and accuracy of the adjustment. It is based on mounting the resonators on a tray in rows and columns and simultaneously exposing two rows at a time to an ion gun with a race-track-shaped beam pattern whose two straight tracks are spaced at a multiple of the inter-row distance d. The tray can be moved in steps of d such that each row is sequentially exposed to a "pre-etch" and "final-etch" stage, with time between the two exposures for the resonators to cool down after the "pre-etch" stage. The accuracy can be further enhanced by making the final-etch rate smaller than the pre-etch rate.

BRIEF DESCRIPTION OF THE DRAWINGS

The invention can take various forms. The drawings are only for the purpose of illustrating one of the preferred embodiments and are not to be construed as limiting the invention.

FIG. 3 illustrates a sequence of tray positions relative to the ion beam pattern.

FIG. 4 illustrates a frequency adjustment cycle.

PREFERRED EMBODIMENTS

The invention relates to the frequency adjustment of piezoelectric resonators by ion etching.

For an explanation of a system according to the invention, it is assumed that the resonators are electroded quartz crystals mounted in an "SMD" (Surface Mount Device) package.

Figure 1:
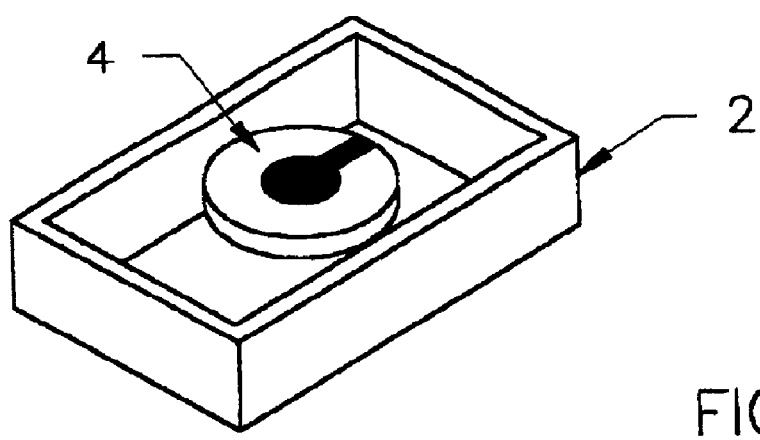
FIG. 1 refers to prior art and shows an open SMD package with a resonator mounted and exposed for adjustment by ion etching.

FIG. 1 shows an open SMD package 2 including an electroded resonator 4.

The package is shown without its top lid, with the resonator exposed and ready for frequency adjustment. The resonator contacts are at the bottom of the package (not shown).

Figure 2:
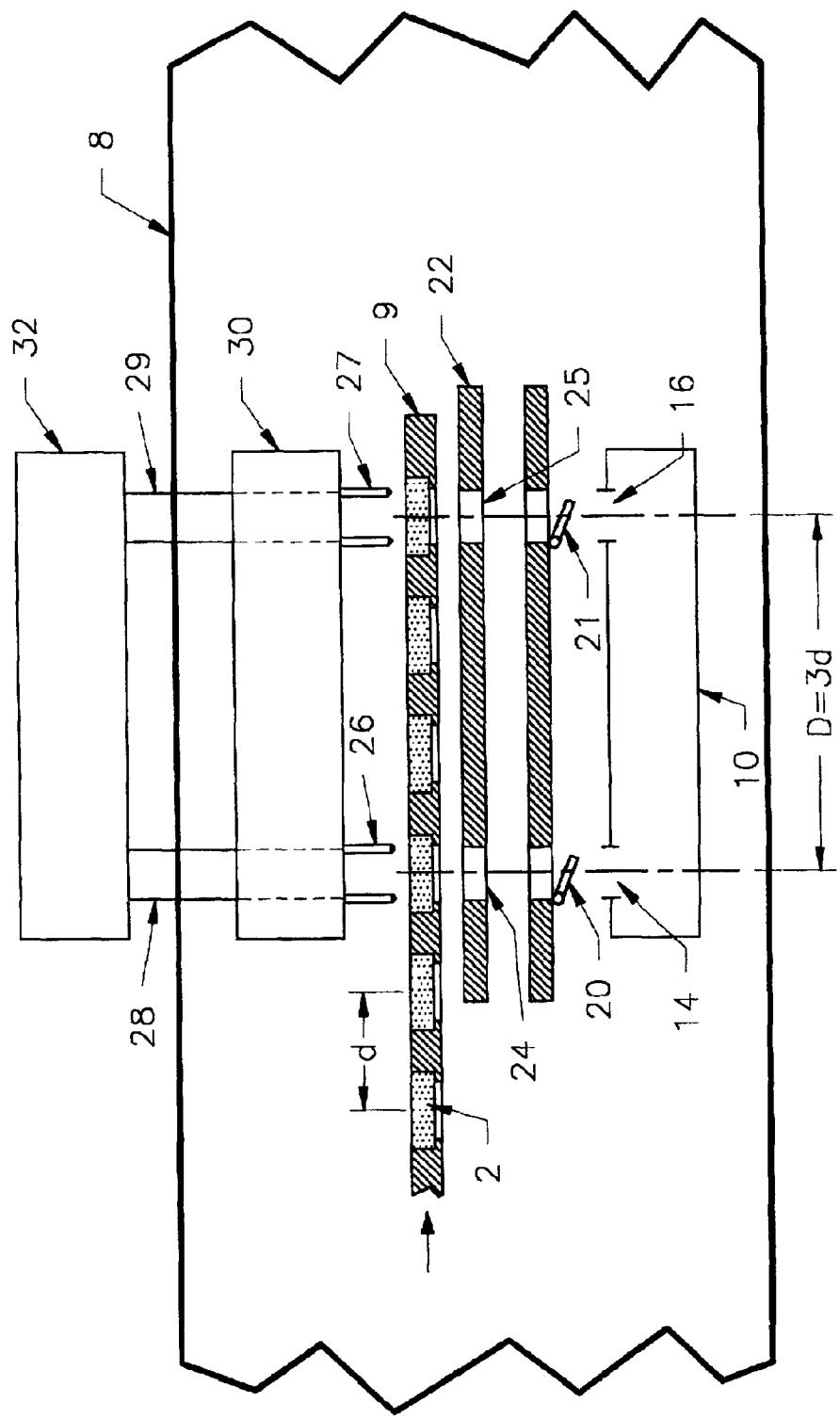
FIG. 2 shows the cross section of an adjustment system according to the invention.

FIG. 2 shows the schematic cross section of a system according to the invention. A vacuum chamber 8 contains an ion gun 10 with a race-track-shaped beam pattern having two parallel straight-track portions 14 and 16. FIG. 2 further includes a tray 9 with rows of SMD packages 2 facing the ion beam and having an inter-row distance d, two rows of shutters 20 and 21, a mask 22 with two rows of apertures 24 and 25, two rows of spring loaded ("pogo") contact pins 26 and 27 held in a contact pad 30, and connections 28 and 29 to a control module 32 for monitoring the resonator frequencies and controlling system functions such as vacuum and shutter operations and the movements of tray 9 and contact pad 30. The control module includes provisions for setting target values for the monitored frequencies and for terminating adjustment when these values are reached.

The distance between the two straight tracks 14 and 16 of the ion beam pattern is D=3d, and only these two portions of the beam are utilized. The remaining two round portions of the beam are shielded so they do not interfere with the system operation.

The rows of resonators, pogo pins, shutters, and mask apertures are all aligned with the ion beam tracks 14 and 16. Before adjustment, the contact pad 30 is lowered so the two rows of pogo pins connect with the resonator contacts. Then both rows of shutters are opened, and the two rows of resonators facing the two beam tracks are simultaneously exposed to ion etching. During the adjustment the resonator frequencies increase and are monitored by control module 32 until they reach predetermined target values. At that instant, the shutters are closed, the ion flow to the resonators is interrupted, and the adjustment is finished.

The ion bombardment causes the resonators to heat up during the adjustment. Since the resonator frequencies are temperature dependent, they will drift as the resonators cool down after the adjustment. This causes an error in the adjustment. Depending on the resonator, the frequency drift may be positive or negative, i.e. the error cannot be eliminated or reduced by offsetting the target frequencies by the amount of the expected frequency drift. However, the error can be minimized by first adjusting the resonators to a pre-target frequency close to the final target, then waiting for the resonators to cool down, and then adjusting them to target. If the final adjustment step is small, the heat effect and thereby the adjustment error can be minimized.

FIG. 3-0 shows a view of the race-track-shaped ion beam pattern of the ion gun, including its straight-line track portions 14 and 16. Further, it shows a tray 9 with 16 rows of SMD packages 2 and an inter-row distance d. In the position shown, none of the rows of resonators is exposed to the ion beam. The tray can be moved in STEPS of d toward and across the beam pattern in the direction indicated by the arrow in FIG. 3-0.

FIGS. 3-1,2,3,4 show the tray after moving one, two, three, and four steps beyond the starting position in FIG. 3-0.

In position 3-1, row 1 is exposed to track 14 of the ion beam. In steps 2 and 3, rows 2 and 3, respectively, are sequentially exposed to track 14. In step 4, row 1 is exposed to track 16 and row 4 is exposed to track 14. For the next 10 steps, two rows of resonators are simultaneously exposed to tracks 14 and 16. Then, in the last 3 steps, the final three rows are sequentially exposed to track 16.

The system can be used as follows: in track 14, all resonators are adjusted to a pre-target frequency FP that is close to target, and in track 16 they are adjusted to the final target frequency FT. In this manner, the resonator adjustment proceeds in two STAGES:

Stage 1, a pre-etch stage in track 14, preferably covering a large frequency change, and Stage 2, a final-etch stage in track 16, preferably covering a small frequency change.

Between these stages there is a cool-off period during which a row is advanced 3 steps from track 14 to track 16.

Each stage comprises adjustment CYCLES.

In the first cycle of stage 1, all resonator frequencies are measured, all shutters are opened, the etching is started, and the resonator with the highest frequency is monitored until it reaches FP. At that instant, its shutter is closed. Meanwhile, the 7 other resonators have been etched by approximately the same amount.

In the second cycle, the 7 remaining resonator frequencies are measured. The resonator with the highest frequency is monitored until it reaches FP, at which instant its shutter is closed. Meanwhile, the 6 "remaining" resonator frequencies have been raised by about the same amount.

In this manner, the cycles are repeated until all resonator frequencies have reached FP. The time required for the frequency measurements can be made small enough to allow the shutters for the "remaining" resonators to stay open during the measurements. This can be explained by a practical example:

A typical time for one frequency measurement is 10 msec (milliseconds), hence the time for the (worst case) measurement of the 7 frequencies after cycle 1 is 70 msec. A typical etch speed is 100 ppm (parts per million) of the target frequency. This means that during the measurement of the 7 frequencies, all 7 resonators are being etched by 7 ppm. This is a relatively small amount, and it is absorbed in the subsequent etching cycle.

The procedure can be further explained by reference to FIG. 4, which illustrates the stage 1 adjustment cycle of a row of 8 resonators to a target frequency of 20 MHz. The circles denote the resonators frequencies before adjustment. The frequencies range from a low value of FL=19.972 MHz to a high value of FH=19.992 MHz over a "spread" of 20 kHz. The target frequency is 20 MHz, and the pre-target frequency FP is chosen to be 19.998 MHz. Before starting the first cycle, all frequencies are measured. Then the resonator with the highest frequency is adjusted by an amount of "delta F" to the pre-target frequency FP. Meanwhile, the 7 other resonators have been raised by the same "delta F". The frequencies of all 8 resonators, after this first step are marked by crosses.

The subsequent 7 cycles of stage 1 proceed in an analogous fashion until all resonator frequencies lie approximately at the pre-target frequency FP.

Stage 2 includes 8 adjustment cycles, each of them comprising an adjustment of a resonator from the pre-target frequency FP to the target frequency FT. Before starting the adjustment, all stage 2 shutters are closed. During the adjustment, the shutters are opened one at a time, and the resonator frequencies are sequentially raised to the target frequency. As explained before, the stage 1 and stage 2 adjustments occur simultaneously for 10 of the 16 tray positions.

The approach maximizes both throughput and accuracy. High throughput is achieved by the simultaneous adjustment of two rows of resonators. High accuracy is obtained by providing a cool-down period after pre-target adjustment, and by choosing a small second-stage adjustment, thereby reducing the frequency drift after adjustment.

A further improvement in accuracy can be obtained by making the etch rate in the second stage smaller than in the first stage. One way of achieving this is by using a gun whose beam density in the final-adjustment stage is weaker than in the pre-adjustment stage. Another way is by partial closing of the shutters in the final-adjustment stage.

What is claimed is:

1. An apparatus for frequency adjustment of piezoelectric resonators by ion etching in a vacuum chamber, comprising:

a tray holding multiple resonators in a matrix pattern of columns and rows, facing the tray, an ion gun having a race-track shaped beam pattern, including two straight-track portions, means for aligning two rows of resonators with the two straight-track portions of the ion beam, and for stepping the tray to the next two rows of resonators, means for controlling the ion flow to the resonators, instrumentation for monitoring the frequency of the exposed resonators and for cutting off the ion flow when the resonator frequencies reach predetermined target values.

2. The apparatus according to claim 1, wherein the distance between the two straight-track portions of the racetrack pattern is a multiple of the distance between two adjacent rows of the tray, the ion flow is controlled by two rows of shutters positioned between the resonators and the two straight-track portions of the ion gun.

3. The apparatus according to claim 1, wherein the ion flow to the two rows of resonators is unequal.

4. The apparatus according to claim 3, wherein the unequal ion flow is obtained by partial closing of a row of shutters.

5. A method for frequency adjustment of piezoelectric resonators by ion etching in a vacuum chamber, based on holding the resonators in a tray of columns and rows, facing the resonators with an ion gun having a race-track shaped beam pattern including two straight-track beam portions, aligning two rows of resonators with the two straight-track portions of the ion beam, controlling the ion flow to the resonators, monitoring the frequency of the exposed resonators and cutting off the ion flow when the resonators reach predetermined target values, stepping the tray to the next row of resonators and repeating the adjustment process.

6. The method according to claim 5, further including controlling the ion flow by means of shutters.

7. The method according to claim 5, wherein controlling the ion flow includes:

controlling the ion flow such that the ion flow to the two rows of resonators is unequal.

8. The method according to claim 5, further including:

reducing the ion flow to one of the rows of resonators.

9. The method according to claim 8, wherein reducing the ion flow to one of the rows of resonators includes:

partially blocking the ion flow with at least one shutter.

* * * * *